(12) United States Patent
Kumar

(10) Patent No.: US 9,306,550 B2
(45) Date of Patent: Apr. 5, 2016

(54) SCHMITT TRIGGER IN FDSOI TECHNOLOGY

(71) Applicant: STMicroelectronics International N.V., Amsterdam (NL)

(72) Inventor: Ravinder Kumar, Ambala (IN)

(73) Assignee: STMicroelectronics International N.V., Amsterdam (NL)

( * ) Notice: Subject to any disclaimer, the term of this patent is extended or adjusted under 35 U.S.C. 154(b) by 59 days.

(21) Appl. No.: 14/216,719

(22) Filed: Mar. 17, 2014

(65) Prior Publication Data

US 2015/0263707 A1    Sep. 17, 2015

(51) Int. Cl.
*H03K 3/3565*    (2006.01)

(52) U.S. Cl.
CPC .................... *H03K 3/3565* (2013.01)

(58) Field of Classification Search
USPC .......... 327/205–206, 208, 210, 534–535, 537
See application file for complete search history.

(56) References Cited

U.S. PATENT DOCUMENTS

| | | | |
|---|---|---|---|
| 6,833,749 B2* | 12/2004 | Erstad | 327/534 |
| 8,236,631 B2* | 8/2012 | Afentakis et al. | 438/151 |
| 2006/0232313 A1* | 10/2006 | Favard | 327/205 |

OTHER PUBLICATIONS

Filanovsky et al., "CMOS Schmitt Trigger Design," Transactions Briefs, *IEEE Transactions on Circuits and Systems—I:Fundamental Theory and Applications* 41(1):46-49, Jan. 1994.

* cited by examiner

*Primary Examiner* — An Luu
(74) *Attorney, Agent, or Firm* — Seed IP Law Group PLLC

(57) ABSTRACT

A Schmitt Trigger is implemented in FDSOI technology. The Schmitt Trigger includes a first inverting stage having an NMOS and PMOS transistor having their drains tied together. The NMOS and PMOS transistor each have a first gate coupled to the input voltage and a back gate coupled to the output of the Schmitt Trigger.

18 Claims, 4 Drawing Sheets

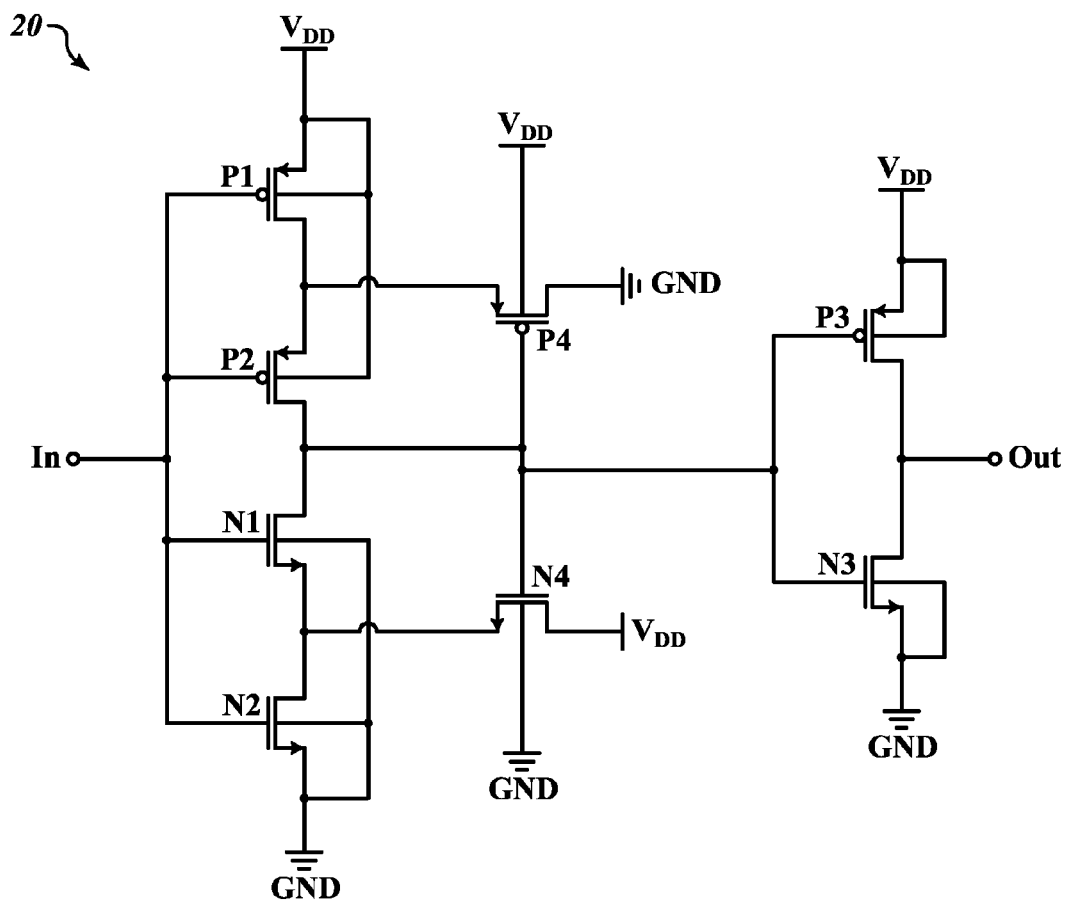
FIG. 2 *(Prior Art)*

SCHMITT TRIGGER IN FDSOI TECHNOLOGY

BACKGROUND

1. Technical Field

The present disclosure relates to integrated circuit dies. The present disclosure relates more particularly to Schmitt triggers implemented in integrated circuit dies.

2. Description of the Related Art

As integrated circuit die technology continues to advance, the structures formed within the integrated circuit die continue to shrink. As structures within the integrated circuit die continue to shrink, they become more sensitive to high voltages and currents. Thus, many circuits within the integrated circuit die include protection measures to ensure that high voltages are not applied to sensitive components.

BRIEF SUMMARY

One embodiment is an integrated circuit die in which a Schmitt trigger has been formed. The Schmitt trigger includes a first inverter stage and a second inverter stage. The input of the first inverter stage is the input of the Schmitt trigger. The output of the second inverter stage is the output of the Schmitt trigger. The first inverter stage includes a first PMOS transistor and a first NMOS transistor each having a respective first gate coupled to the input and separated from respective channel regions by a first gate dielectric layer. The first NMOS and PMOS transistors each include a respective second gate separated from the respective channel regions by a second gate dielectric layer. The channel region of the NMOS and PMOS transistors is positioned between the first gate and the second gate, separated from them by the respective gate dielectrics. The first NMOS and PMOS transistors each receive on the second gate the output of the Schmitt trigger. The drain regions of the first NMOS and PMOS transistors are connected together at the output of the first inverter stage. The input of the second inverter stage is coupled to the output of the first inverter stage.

In one embodiment, the first inverter stage includes a second PMOS transistor having a drain terminal connected to the source terminal of the first transistor and a source terminal connected to a high-voltage supply $V_{DD}$. The second PMOS transistor includes a first gate coupled to the input and the second gate coupled to the high-voltage supply $V_{DD}$. The first inverter stage further includes a second NMOS transistor having a drain terminal coupled to the source terminal of the first NMOS transistor and a source terminal connected to a low voltage supply GND. The first gate of the second NMOS transistor is coupled to the input and a second gate of the second NMOS transistor is coupled to the low voltage supply GND.

In one embodiment, the hysteresis, and therefore the high and low thresholds of the Schmitt trigger, is set due to skew in the threshold voltage of the first NMOS and PMOS transistors. The skew in the threshold voltage exists due to applying the output Out to the back gate of the first NMOS and PMOS transistors.

BRIEF DESCRIPTION OF THE SEVERAL VIEWS OF THE DRAWINGS

FIG. 2 is a schematic diagram of a known Schmitt trigger.

DETAILED DESCRIPTION

Figure 1A:
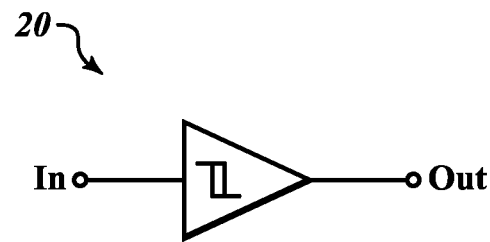
FIG. 1A is a simplified diagram of a Schmitt trigger according to one embodiment.

FIG. 1A is an illustration of a Schmitt trigger 20 according to one embodiment. The Schmitt trigger 20 includes an input In and an output Out. The Schmitt trigger 20 functions as a type of comparator that compares the input voltage to a low threshold value and a high threshold value and outputs either a high or low value depending on hysteresis. The high threshold value of the Schmitt trigger 20 is a voltage between the low threshold value and the high supply voltage $V_{DD}$. The low threshold value is a voltage between the high threshold value and the low supply voltage GND. The function of the Schmitt trigger 20 is made clear by the graph of FIG. 1B.

Figure 1B:
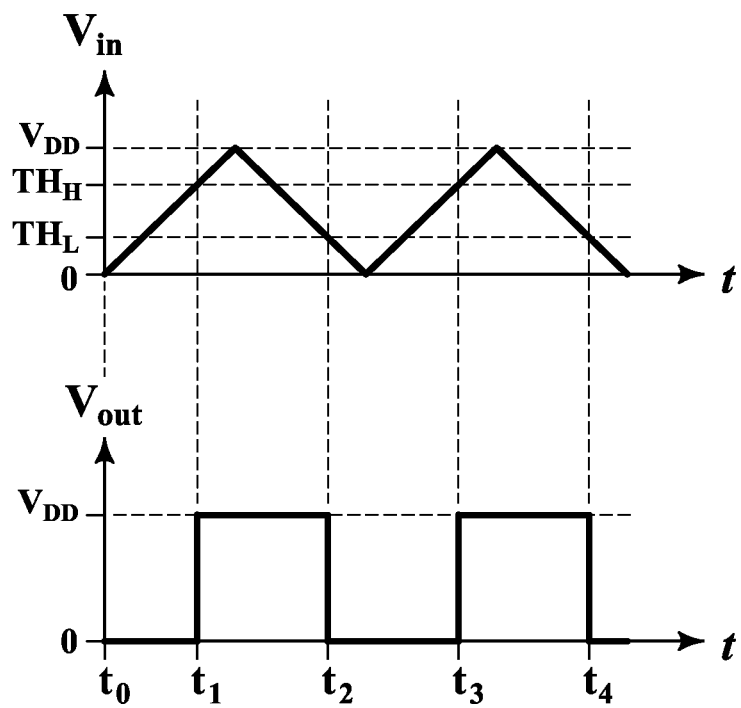
FIG. 1B is a graph illustrating how an output voltage of the Schmitt trigger is affected by the input voltage and the high and low thresholds of the Schmitt trigger according to one embodiment.

FIG. 1B includes a graph of the input voltage Vin of the Schmitt trigger 20 versus time t. FIG. 1B also includes a graph of the output voltage Vout of the Schmitt trigger 20 versus time. The input voltage in FIG. 1A follows a sawtooth pattern between 0 V and $V_{DD}$. At time $t_0$, the input and output voltage Vout is 0 V. As the input voltage begins to rise from 0 V it passes the low threshold value $TH_L$ while the output voltage Vout remains 0 V. At time $t_1$, the voltage Vin on the input In passes the high threshold value $TH_H$. When Vin crosses the high threshold value the output voltage Vout transitions from 0 V to $V_{DD}$. The input voltage Vin continues to rise until it reaches $V_{DD}$, at which point it begins to decline. As the input voltage Vin crosses below the high threshold value $TH_H$, the output voltage Vout remains at $V_{DD}$. At time $t_2$, the input voltage Vin passes below the low threshold value $TH_L$. When the input voltage Vin passes the low threshold value $TH_L$ the output voltage Vout transitions from $V_{DD}$ to 0 V. The output voltage Vout remains at 0 V until the input voltage Vin again rises above the high threshold value at time $t_3$. At time $t_3$ the output voltage Vout transitions from 0 V to $V_{DD}$. The output voltage remains at $V_{DD}$ until the input voltage passes below the low threshold value $TH_L$ at time $t_4$. Thus, due to hysteresis the output voltage Vout of the Schmitt trigger 20 only transitions from the load to the high value when the input voltage Vin crosses the high threshold value. Likewise, the output voltage Vout of the Schmitt trigger 20 only transitions from $V_{DD}$ to 0 V when the input voltage Vin crosses below the low threshold value.

Because of the hysteresis effect, the Schmitt trigger 20 acts as a comparator that is not affected by jitter. A conventional comparator which compares an input voltage to a threshold can erroneously switch between the high and low output values when a noisy input signal is close in value to the threshold. The Schmitt trigger 20 avoids this as the transitions between the high and low output values only occur when the input voltage rises above the two thresholds $TH_H$ and $TH_L$ or passes below the two thresholds $TH_H$ and $TH_L$. An input voltage with some noise or jitter between the high and low thresholds will not cause faulty transitions of the output voltage Vout between the high and low values.

FIG. 2 is a schematic diagram of a known Schmitt trigger 20. The Schmitt trigger 20 of FIG. 2 is made in common CMOS technology in which the transistors of the Schmitt trigger 20 each include a single gate and a body connection in a semiconductor substrate. The Schmitt trigger 20 has a first inverter stage including PMOS transistors P1 and P2 and NMOS transistors N1 and N2. The source of transistor P1 is coupled to the high supply voltage $V_{DD}$. The drain of the transistor P1 is coupled to the source of the transistor P2. The drain of the transistor P2 is coupled to the drain of the transistor N1. The drains of the transistors N1 and P2 correspond to the output of the first inverter stage of the Schmitt trigger 20. The source of the transistor N1 is coupled to the drain of the transistor N2. The source of the transistor N2 is coupled to the low supply voltage GND. The gate terminals of the transistors P1, P2, N1, N2 are all coupled to the input In. The body terminals of the transistors P1 and P2 are coupled to $V_{DD}$. The body terminals of the transistors N1 and N2 are coupled to GND.

The Schmitt trigger 20 further includes PMOS transistor P4 and NMOS transistor N4. The gate electrodes of the PMOS transistor P4 and the NMOS transistor N4 are coupled together at the output of the first inverter stage, the drain terminals of the transistors P2 and N1. The drain terminal of the transistor P4 is coupled to GND. The source terminal of the transistor P4 is coupled to the drain terminal of the transistor P1. The drain terminal of the transistor N4 is coupled to $V_{DD}$. The source terminal of the transistor N4 is coupled to the source terminal of the transistor N1. The body terminal of the transistor P4 is coupled to $V_{DD}$. The body terminal of the transistor N4 is coupled to GND.

The Schmitt trigger 20 has a second inverting stage including the transistors P3 and N3. The gate terminals of the transistors P3 and N3 are coupled to the drain terminals of the transistors P2 and N1. The source terminal of the transistor P3 is coupled to $V_{DD}$. The drain terminal of the transistor P3 is coupled to the drain terminal of the transistor N3 at the output of the Schmitt trigger 20 Out. The source terminal of the transistor N3 is coupled to GND.

The Schmitt trigger 20 functions in the following manner: when the voltage $V_{DD}$ is supplied to the input In of the Schmitt trigger 20, the first inverting stage brings the output at the drain of transistors P2 and N1 to GND. This is because the voltage $V_{DD}$ renders the transistors P1 and P2 nonconducting and renders the transistors N1 and N2 conducting. With N1 and N2 conducting, the drain of the transistor N1 is electrically connected to GND through the source of the transistor N2. The second inverting stage receives at the gate terminals of the transistors P3 and N3 the GND voltage from the drains of the transistors P2 and N1. This GND voltage renders the transistor P3 conducting and the transistor N3 nonconducting. The output terminal Out of the Schmitt trigger 20 is therefore electrically connected to $V_{DD}$ through the source of the transistor P3. Thus, when the input In of the Schmitt trigger 20 receives the high voltage $V_{DD}$, the Schmitt trigger 20 outputs the voltage $V_{DD}$. In like manner, when the input of the Schmitt trigger 20 receives the GND voltage, transistors P1 and P2 are rendered conducting while the transistors N1 and N2 are rendered nonconducting. The drain of the transistor P2 is therefore electrically connected to $V_{DD}$ to the source of the transistor P1. The gate terminals of the transistors P3 and N3 are therefore connected to $V_{DD}$. This renders the transistor P3 nonconducting and the transistor N3 conducting. The output Out of the Schmitt trigger 20 is therefore connected to GND through the source of the transistor N3.

Hysteresis is introduced to the Schmitt trigger 20 by means of the transistors P4 and N4. Let us take for example the case in which at time t=0, both the input and the output are at GND. The low voltage GND at In renders P1 and P2 conducting while rendering N1 and N2 nonconducting. In this case, the drain terminals of the transistors P2 and N1 are at $V_{DD}$. This renders N4 conducting and P4 nonconducting. Because the circuit of FIG. 2 is formed using conventional CMOS technology, N1 exhibits a body biased effect as its bulk to source voltage is not zero. Thus, N1 and N2 have different threshold voltages from each other. In particular, the threshold voltage of the transistor N1 is increased with respect to the threshold voltage of the transistor N2. If the voltage at the input In begins to rise, N2 turns on first when In reaches the threshold voltage of transistor N2. N1 does not turn on as its threshold voltage is higher due to the body biased effect. Hence, the output of the first inverter remains at the high voltage $V_{DD}$. Transistors N2 and N4 form an inverter having a feedback effect with N4 acting as the pull up device. The source of the transistor N1 is connected to the voltage $V_{DD}$ minus the threshold voltage of N4. As the input In is greater than the threshold voltage of N2, the source of N1 begins to fall. When the gate to source voltage of N1 is greater than the threshold voltage of N1, N1 turns ON. The voltage on drain of the transistor N1 begins to decrease, thereby rendering the transistor N4 less conductive. At this point, the voltage on the drain of the transistor N1 rapidly transitions to GND. The input voltage at which the drain of the transistor N1 goes to GND is the high threshold value. The high threshold voltage is set by the W/L ratios of N2 and N4.

Because the drains of the transistors N1 and N2 are now at GND, the transistor N4 is rendered entirely nonconducting and the transistor P4 is rendered conducting. In this case, the drain terminals of the transistors P2 and N1 are at GND. Because the circuit of FIG. 2 is formed in conventional CMOS technology, P2 shows a body biased effect as its bulk to source voltage is not zero. Thus, P1 and P2 have different threshold voltages from each other. In particular, the threshold voltage of transistor of P2 is increased with respect to the threshold voltage of the transistor P1. As the voltage at the input In begins to fall, P1 turns on first when the input In reaches the threshold voltage of P1. P2 does not turn on as its threshold voltage is higher than the threshold of P1 due to the body biased effect. Hence, the output of the first inverter remains at the low voltage Gnd. This renders P4 conducting and N4 nonconducting. The transistors P4 and P1 form an inverter having a feedback effect, with P4 acting as the pull down device. When the input In decreases to a point where P1 begins to conduct, the voltage on the source of P2 begins to rise. When the gate to source voltage of P2 is greater than the threshold voltage of P2, P2 turns ON. The voltage on the drain of the transistor P2 begins to increase, rendering the transistor P4 less conductive. At this point, the voltage on the drain of the transistor P2 rapidly transitions to $V_{DD}$. The low threshold voltage of the conventional Schmitt trigger is set by the W/L ratio of P1 and P4.

The high and low threshold values $TH_H$ and $TH_L$ can be selected by carefully selecting the width to length ratios of the transistors N2, N4, and P1, P4. As the width to length ratio of the transistor P1 increases with respect to the width to length ratio of the transistor P4, the low threshold value $TH_L$ increases from GND. As the width to length ratio of the transistor N2 increases with respect to the width to length ratio of the transistor N4, the high threshold value $TH_H$ decreases from $V_{DD}$. Thus, by carefully selecting the width to length ratios of the transistors P1, P4, and N2, N4, appropriate high and low threshold values can be achieved. The high and low threshold values implement hysteresis into the Schmitt trigger 20, thereby reducing the sensitivity of the circuit to noise and jitter.

However, the Schmitt trigger 20 of FIG. 2 has many drawbacks. Hysteresis is introduced by including extra transistors P4 and N4, which consumes area of the semiconductor substrate. The leakage of the Schmitt trigger 20 is large because the high and low threshold voltages are set by the inverters N2, N4 and P1, P4. The inverters try to pull-up and pull-down the sources of N1 and P2, respectively, during switching of the input signal. This causes high leakage. Because the Schmitt trigger 20 of FIG. 2 is implemented in standard CMOS technology, the continuous shrinking of transistor sizes means that the gate dielectrics of the several transistors must become increasingly thinner. As the gate dielectrics become thinner, the transistors become more susceptible to damage from high voltages such as 2.5V or 3.3V. In particular, typically the Schmitt trigger of FIG. 2 cannot withstand voltages higher than 1.8 V. The standard Schmitt trigger for higher voltage like 2.5V or 3.3V uses three inverters as shown more clearly in FIG. 4. Hysteresis is provided by the second and third inverters connected back to back. This increases the complexity and area of the circuit for high voltage application.

Figure 3:
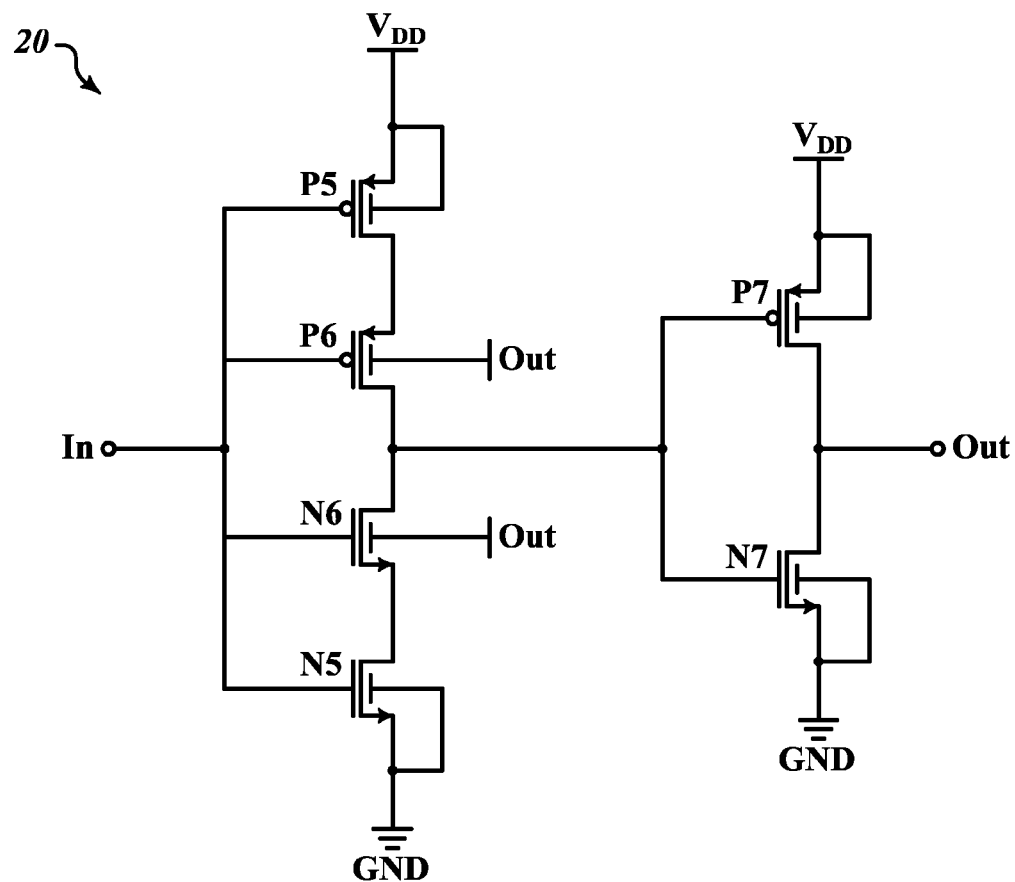
FIG. 3 is a schematic diagram of a Schmitt trigger according to one embodiment.

FIG. 3 is a schematic diagram of a Schmitt trigger 20 according to one embodiment. The Schmitt trigger 20 of FIG. 3 is implemented in fully depleted silicon on insulator (FD-SOI) technology. Because the Schmitt trigger 20 of FIG. 3 is implemented in FDSOI technology, many benefits can be achieved, as will be set forth in more detail below.

The Schmitt trigger 20 of FIG. 3 has an input In and an output Out. The Schmitt trigger 20 also has a first inverting stage including PMOS transistors P5, P6, and NMOS transistors N5, N6. The source terminal of the transistor P5 is connected to $V_{DD}$. The gate of the transistor P5 is coupled to the input In. The transistor P5 also includes a back gate coupled to $V_{DD}$. The source of the transistor P6 is coupled to the drain of the transistor P5. The gate of the transistor P6 is coupled to the input In. The back gate of the transistor P6 is coupled to the output Out of the Schmitt trigger 20. The drain of the transistor N6 is coupled to the drain of the transistor P6 and is the output of the first inverting stage of the Schmitt trigger 20. The gate of the transistor N6 is coupled to the input In. The back gate of the transistor N6 is coupled to the output Out. The drain of the transistor N5 is coupled to the source of the transistor N6. The gate of the transistor N5 is coupled to the input In. The back gate and the source of the transistor N5 are connected to GND.

The Schmitt trigger 20 of FIG. 3 includes a second inverting stage. The second inverting stage includes transistors P7 and N7. The gates of the transistors P7 and N7 are connected to the drain terminal of the transistor N6. The gate terminals of the transistors P7 and N7 are the input of the second inverting stage. The source terminal and the second gate of the transistor P7 are connected to $V_{DD}$. The drain terminal of the transistor N7 is connected to the drain terminal of the transistor P7 at the output terminal Out. The source and the back gate of the transistor N7 are connected to GND.

The Schmitt trigger 20 functions in the following manner: when an input voltage $V_{DD}$ is supplied to the input In of the Schmitt trigger 20, the first inverting stage brings the output at the drain of transistors P6 and N6 to GND. This is because the voltage $V_{DD}$ renders the transistors P6 and P5 nonconducting and renders the transistors N6 and N5 conducting. With N6 and N5 conducting, the drain of the transistor N6 is electrically connected to GND through the source of the transistor N5. The second inverting stage receives at the gate terminals of the transistors P7 and N7 the GND voltage from the drains of the transistors P6 and N6. The GND voltage renders the transistor P7 conducting and the transistor N7 nonconducting. The output terminal Out of the Schmitt trigger 20 is therefore electrically connected to $V_{DD}$ through the source of the transistor P7. Thus, when the input In of the Schmitt trigger 20 receives the high voltage $V_{DD}$, the Schmitt trigger 20 outputs the voltage $V_{DD}$. In like manner, when the input of the Schmitt trigger 20 receives the GND voltage, transistors P5 and P6 are rendered conducting while the transistors N5 and N6 are rendered nonconducting. The drain of the transistor P6 is therefore electrically connected to $V_{DD}$ through the source of the transistor P5. The gate terminals of the transistors P7 and N7 are therefore connected to $V_{DD}$. This renders the transistor P7 nonconducting and the transistor N7 conducting. The output Out of the Schmitt trigger 20 is therefore connected to GND through the source of the transistor N7.

Figure 5:
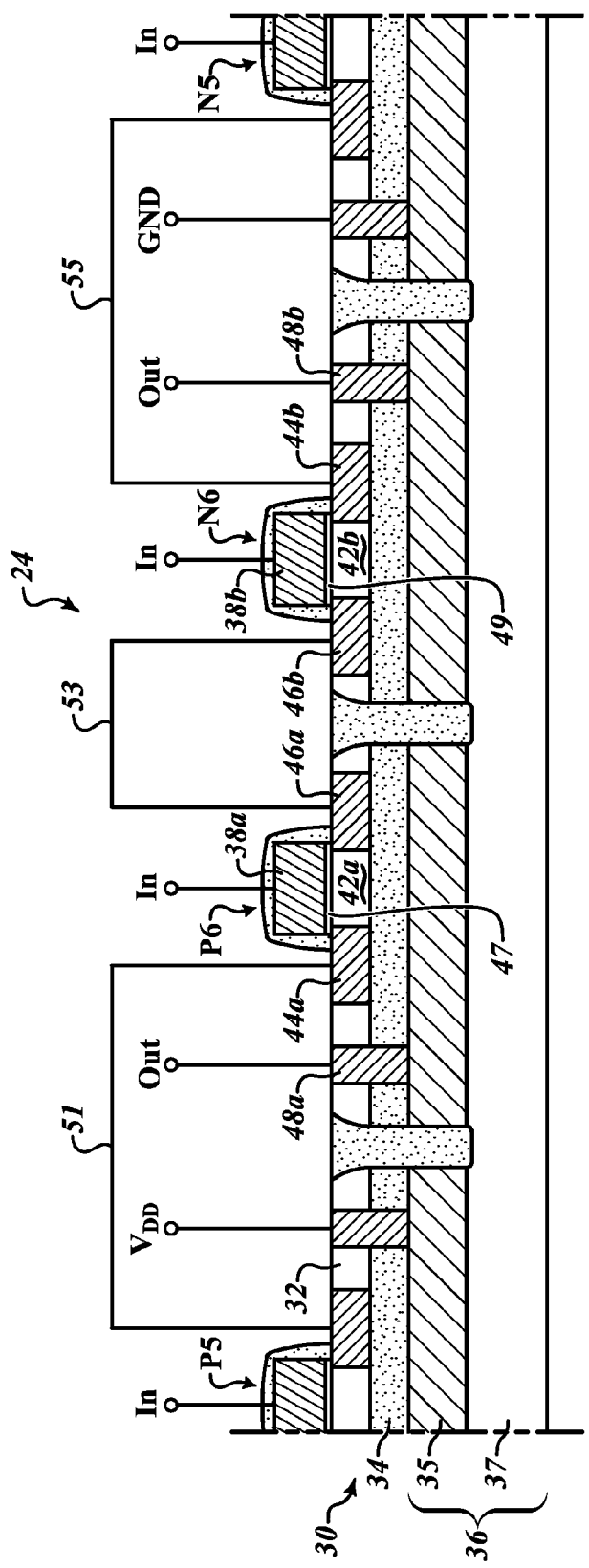
FIG. 5 is a cross section of an integrated circuit die implemented in FDSOI technology and including a Schmitt trigger according to one embodiment.

Hysteresis is introduced into the Schmitt trigger 20 of FIG. 5 via the back gates of the transistors P6 and N6. When the Input In is at the low voltage level GND, the node Out is at the Low voltage level GND. Because Out is connected to the back gate of P6, the low voltage at back gate lowers the threshold voltage of P6. Similarly, the case when input In is at the high voltage level VDD, Out is at VDD. Because Out is connected to the back gate of the transistor N6, the high voltage level at the back gate lowers the threshold voltage of N6. The back gate connection sets two threshold voltages for the transistors P6 and N6 depending upon the voltage at output node OUT. N6 has higher threshold voltage when its back gate is at the low voltage level GND compared to when its back gate is at the high voltage level $V_{DD}$. Similarly P6 has a higher threshold voltage when its back gate is at the high voltage level $V_{DD}$ compared to when its back gate is at the low voltage level GND. The skew in the threshold voltages of transistors P6 and N6 due to their back gate connection helps in the creation of a Hysteresis effect in this design.

In an example in which at time $t_0$ the input In is at GND and the output Out is also at GND. As the voltage at the input In begins to rise, the transistors P5 and P6 become less conductive while the transistors N5 and N6 become more conductive. As the back gate of the transistor N6 is connected to GND, its threshold voltage is higher than when the output node Out is at $V_{DD}$. The transistor N6 will not become conductive until the gate to source voltage of the transistor N6 surpasses the increased threshold voltage of the transistor N6. The high threshold value $TH_H$ is set by the threshold voltage modification due to the back gate of the transistor N6 to the output Out. Therefore, until the input voltage reaches the high threshold value, the voltage at the drain of the transistor N6 will be pulled towards GND. Once the input voltage reaches the high threshold value, the drain of the transistor N6 will approach GND and the output Out will transition to $V_{DD}$ at time $t_1$.

After time $t_1$, the input In is at $V_{DD}$ and the output Out is also at $V_{DD}$. As the voltage at the input In begins to fall, the transistors P5 and P6 become more conductive while the transistors N5 and N6 become less conductive. As the back gate of transistor P6 is connected to VDD, its threshold voltage is higher than when the output node Out is at GND. The transistor P6 will not become conductive until the source to gate voltage of the transistor P6 surpasses the increased threshold voltage of the transistor P6. The low threshold value $TH_L$ is set by the threshold voltage modification due to the back gate connection of the transistor P6 to the output Out. Therefore, until the input voltage reaches the low threshold value, the voltage at the drain of the transistor P6 will not reach $V_{DD}$. Once the input voltage reaches the low threshold value, the drain of the transistor N6 will approach $V_{DD}$ and the output Out will transition to GND. The high and low threshold voltages $TH_H$ and $TH_L$ are primarily determined by the pull up/pull down capability of the first inverter, the feedback of second inverter, and the W/L ratios of P6 and N6.

The circuit of FIG. 3 has many benefits over the circuit of FIG. 2. The circuit of FIG. 2 included eight transistors. The circuit of FIG. 3 includes only six transistors. Because of the reduced number of transistors, and because the width of the transistors of FIG. 3 are smaller than the width of the transistors of FIG. 2, the area of the semiconductor substrate consumed by FIG. 3 is about 70% smaller than the area of the semiconductor substrate consumed by the circuit of FIG. 2. Additionally, because the width to length ratios are lower in the circuit of FIG. 3, there is lower leakage current. As there exists no contention in this circuit, there is low leakage current and the sizes of transistors are small. The peak current is also lower. Furthermore, the circuit of FIG. 3 can withstand much higher voltages e.g. 2.5V or 3.3V due to the FDSOI technology implemented in the circuit of FIG. 3.

Figure 4:
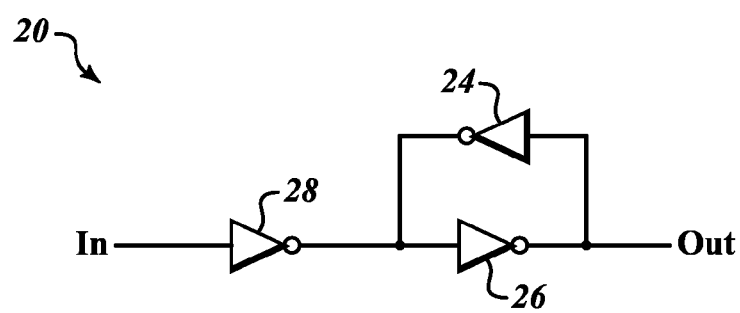
FIG. 4 is a schematic diagram of a known Schmitt trigger for higher voltages.

FIG. 4 is a schematic diagram of a standard Schmitt trigger having three inverters 24, 26, and 28 for 2.5V and 3.3 V applications. The inverters 24 and 26 have their inputs and outputs cross coupled together. The output of the inverter 28 is coupled to the output of the inverter 24 and the input of the inverter 26. The input of the inverter 28 is coupled to the input In of the Schmitt trigger 20. The output of the inverter 26 and the input of the inverter 24 are coupled to the output Out of the Schmitt trigger 20. The FDSOI technology Schmitt trigger of FIG. 3 uses only two inverters. This reduces the area and complexity of the circuit. The FDSOI technology will be discussed in further detail with respect to FIG. 5.

FIG. 5 is a cross section of an integrated circuit die 30 showing some transistors in the first inverting stage of the Schmitt trigger 20 according to one embodiment. The integrated circuit die 30 includes a first semiconductor layer 32. The first semiconductor layer is for example between 2 nm and 10 nm thick. The first semiconductor layer 32 is positioned on a buried oxide layer 34. The buried oxide layer 34 is for example between 20 nm and 40 nm thick. The second semiconductor layer 36 is positioned below the buried dielectric layer 34. The second semiconductor layer 36 includes a heavily doped region 35 and an undoped or lightly doped region 37.

The semiconductor layer 32 includes the channel region 42a of the transistor P6 and the channel region 42b of the transistor N6, source regions 44a, 44b of the transistors P6 and N6 and the drain regions 46a, 46b of the transistors P6 and N6 are also positioned in the first semiconductor layer 32. The gate electrode 38a of the transistor P6 is separated from the channel region 42a by the gate dielectric 47 which is, for example, 1 nm thick or less. The gate electrode 38b of the transistor N6 is separated from the channel region 42b by the gate dielectric 49. The gate electrodes 38a and 38b are each coupled to the input In. The source electrode 44a of the transistor P6 is coupled to the drain electrode of the transistor P5 by the conductive line 51. The drain electrode 46a of the transistor P6 is coupled to the drain electrode 46b of the transistor N6 by the conductive line 53. The source electrode 44b of the transistor N6 is connected to the drain electrode of the transistor and N5 by the conductive line 55.

The heavily doped region 35 of the second semiconductor layer 36 includes the back gate of the transistors P6 and N6. The back gate of the transistors P6 and N6 are each coupled to the output Out by the second gate contacts 48a, 48b, respectively. The second gates in the heavily doped region 35 of the second semiconductor layer 36 are isolated from each other by trench isolations. The second gates are separated from the channel regions 42a, 42b by the buried oxide layer 34. The buried oxide layer 34 therefore acts as a second gate dielectric layer separating the channel regions 42a, 42b from the second gates 35. On the other hand, the second gates of transistors P5 and N5 are connected to $V_{DD}$ and GND, respectively.

The transistors P6 and N6 are implemented in FDSOI technology as stated previously. The channel regions 42a, 42b of the transistors P6 and N6 are fully depleted. This is in contrast to standard bulk MOS transistors or standard partially depleted SOI transistors.

In a standard bulk transistor, the semiconductor layer in which the channel region is located can be hundreds of nanometers thick. A charge depleted region forms below the channel region between the source and drain of the standard transistor. The channel region and the charge depleted region below it are typically only a few nanometers thick. Below the charge depleted region is an undepleted bulk semiconductor portion of the semiconductor layer. The bulk semiconductor portion below the channel region is typically at an unknown floating voltage.

A partially depleted SOI transistor differs from a bulk MOS transistor in that there exists a buried oxide (BOX) layer between the channel region and a bulk silicon substrate. A depletion region that is depleted of charge forms below the channel region between the source and drain regions. The depletion region is bounded below by the BOX. The presence of the BOX prevents the substrate voltage from electrically influencing the channel. Otherwise, the extent of the depletion region depends on the relative dimensions of the various layers, as well as source and drain doping profiles. In the case of the partially-depleted SOI transistor, the depletion region does not fill all of the material between the source and the drain, wherein an undepleted portion remains at an undetermined floating electric potential. The presence of the undepleted portion is generally undesirable because it is not well controlled, and yet the associated floating electric potential can electrically influence the channel and degrade the transistor performance.

A fully-depleted SOI (FDSOI) transistor such as P6 and N6 in FIG. 5 also has a BOX layer 34. However, the source and drain regions 44a, 44b, 46a, 46b of the FDSOI transistors P6 and N6, respectively, are shallower than the source and drain regions of a partially depleted SOI device. As a result, the doping profiles are effectively vertical, and the charge characteristics of the channel regions 42a, 42b can be set by the doping concentrations such that a fully charge-depleted region forms between the source and drain 44a, 44b, 46a, 46b, bounded below by the BOX 34, in response to application of a bias voltage to the gate electrodes 38a, 38b. Because all of the material between the source and drain is charge-depleted, the undepleted portion has been eliminated as a possible cause of transistor degradation.

Additionally, the threshold voltages of the transistors P6, N6 can be adjusted by applying a voltage to the back gates of the transistors P6, N6. By applying a high voltage to the back gate of the PMOS transistor P6, the threshold voltage of the PMOS transistor P6 is increased. The threshold voltage corresponds to the voltage difference between the gate and source of a transistor, which will result in the channel region becoming conducting. By applying a low voltage to the back gate of the PMOS transistor P6, the threshold voltage of the transistor P6 is decreased. By applying a high voltage to the back gate of the NMOS transistor N6, the threshold voltage of the NMOS transistor N6 is decreased. By applying a low voltage to the back gate of the NMOS transistor N6, the threshold voltage of the NMOS transistor N6 is increased.

The increasing and decreasing of the threshold voltages of the transistors P6 and N6 by application of a voltage to the back gate allows for hysteresis to be introduced into the Schmitt trigger 24.

In one embodiment, the first semiconductor layer 32 is about 2 nm thick. Thus, the channel regions 42a, 42b are about 2 nm thick. The first gate dielectric which separates the channel regions 42a, 42b from the gate electrodes 38a, 38b is about 1 nm thick. Because the first gate dielectric is so thin, the capacitance between the channel region 42a, 42b and the gate electrodes 38a, 38b is very high. This means that the voltage applied to the gate electrodes 38a, 38b will have a strong effect on the channel regions 42a, 42b. In contrast, the buried oxide layer 34 which acts as a second gate, is about 20 nm thick. Because the buried oxide layer 34 is much thicker than the first gate dielectric, the back gates have a weaker effect on the channel regions 42a, 42b. However, as stated previously, the back gates have a strong enough effect to turn the transistors on or off, even if the back gates are being held at the opposite voltage.

Taking the case in which at time $t_0$ the input In of the Schmitt trigger 24 is 0 V and the output Out is also 0 V, the output of the first stage, which is the drains of the transistors P6, N6, is at $V_{DD}$. As the voltage on the input In begins to increase, the transistor N5 turns on more quickly than the transistor N6 because the transistor N6 has a higher threshold voltage than the transistor N5 when the output Out is at 0 V. Thus, the drain of the transistor N6 is not connected to GND until the transistor N6 is turned on. The voltage on the input In at which the transistor N6 turns on when the output Out is at 0 V is the high threshold voltage of the Schmitt trigger 24.

Taking the case in which at time $t_0$ the input of the Schmitt trigger 24 is $V_{DD}$ and the output Out is also $V_{DD}$, the output of the first stage, which is the drains of the transistors P6, N6, is at 0 V. As the voltage on the input In begins to decrease from $V_{DD}$, the transistor P5 turns on more quickly than the transistor P6 because the transistor P6 has a higher threshold voltage when the output Out is $V_{DD}$. Thus, the drain of the transistor P6 is not connected to $V_{DD}$ until the transistor P6 is turned on. The voltage on the input In at which the transistor P6 turns on when the output Out is at $V_{DD}$ is the low threshold voltage of the Schmitt trigger 24.

The Schmitt trigger 24 implemented in FDSOI technology has many advantages over Schmitt trigger 24 of the prior art. Fewer transistors are used in the Schmitt trigger according to one embodiment. The average current is much lower than in circuit of FIG. 2. The area consumed is also much smaller than in the circuit of FIG. 2. Furthermore, the Schmitt trigger 24 according to one embodiment can operate with higher supply voltages, e.g. 2.5V or 3.3V. The complexity and area of the circuit is much smaller for 2.5V and 3.3 V. This is because the higher voltage can be applied at the back gate because the second gate dielectric is much thicker than the front gate dielectric.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit die:
   a first inverter including;
      a first transistor having a first gate, a second gate, a channel region, a source, and a drain;
      a second transistor having a first gate, a second gate, a channel region, a source, and a drain coupled to the drain of the first transistor;
      an input coupled to the first gates of the first and second transistors; and
      an output coupled to drain terminals of the first and second transistors;
   a second inverter including:
      an input coupled to the output of the first inverter; and
      an output coupled configured to supply an output signal to the second gates of the first and second transistors;
   an insulator layer;
   a first semiconductor substrate on the insulator layer, the channel regions, the sources, and the drains of the first and second transistors being positioned in the first semiconductor substrate;
   a gate dielectric on the first semiconductor substrate, the first gates of the first and second transistors being separated from the first semiconductor substrate by the gate dielectric; and
   a second semiconductor substrate separated from the first semiconductor substrate by the insulator layer, the second gates of the first and second transistors being positioned in the first semiconductor substrate and separated from the respective channel regions by the insulator layer.

2. The integrated circuit die of claim 1 comprising:
   a via in the insulator layer; and
   a conductive material in the via electrically connecting the second gate of the first transistor to the output of the second inverter.

3. The integrated circuit die of claim 1 comprising a third transistor having a drain terminal coupled to the source of the first transistor, a gate coupled to the input, and a source coupled to a high supply voltage.

4. The integrated circuit die of claim 3 comprising a fourth transistor having a drain terminal coupled to the source of the second transistor, a gate coupled to the input, and a source coupled to a low supply voltage.

5. The integrated circuit die of claim 4 wherein the first and third transistors are PMOS transistors.

6. The integrated circuit die of claim 5 wherein the second and fourth transistors are NMOS transistors.

7. The integrated circuit die of claim 6 wherein a channel region width to length ratio of the fourth transistor is greater than a channel region width to length ratio of the second transistor.

8. The integrated circuit die of claim 7 wherein a channel width to length ratio of the third transistor is greater than a channel width to length ratio of the first transistor.

9. The integrated circuit die of claim 8 wherein the first and second inverters comprise a Schmitt trigger, the input of the first inverter being the input of the Schmitt trigger, the output of the second inverter being the output of the Schmitt trigger, a High threshold voltage of the Schmitt trigger based in part on a difference between the channel region width to length ratios of the second and fourth transistors, a Low threshold voltage of the Schmitt trigger based in part on a difference between the width to length ratios of the first and third transistors.

10. A Schmitt trigger comprising:
an input stage including a first and a second transistor each having first gate configured to receive an input voltage and each having a second gate, the input stage configured to output a first output signal on a drain terminal of the first transistor;
an output stage coupled to the input stage and configured to receive the first output signal and to output a second output signal having a high logic value when the input voltage transitions from below a low threshold voltage to above a high threshold voltage and having a low logic value when the input voltage transitions from above the high threshold voltage to below the low threshold voltage, the second gates each receiving the second output voltage;
an insulator layer;
a first semiconductor substrate on the insulator layer, each of the first and second transistors including a channel region, a source, and a drain positioned in the first semiconductor substrate;
a gate dielectric on the first semiconductor substrate, the first gates of the first and second transistors being separated from the first semiconductor substrate by the gate dielectric; and
a second semiconductor substrate separated from the first semiconductor substrate by the insulator layer, the second gates of the first and second transistors being positioned in the first semiconductor substrate and separated from the respective channel regions by the insulator layer.

11. The Schmitt trigger of claim 10 wherein the input stage is a first inverter.

12. The Schmitt trigger of claim 11 wherein the first transistor is a PMOS transistor and the second transistor is an NMOS transistor, the drain terminal of the first transistor being connected to a drain terminal of the second transistor.

13. The Schmitt trigger of claim 12 comprising a third transistor having a gate configured to receive the input voltage, a source configured to receive a high supply voltage, and a drain coupled to a source of the first transistor.

14. The Schmitt trigger of claim 13 comprising a fourth transistor having a gate configured to receive the input voltage, a source configured to receive a low supply voltage, and a drain coupled to the source of the first transistor.

15. A method comprising:
supplying an input voltage to a first gate terminal of a first transistor and to a first gate terminal of a second transistor, each of the first and second transistors having a channel region, a source, and a drain positioned in a first semiconductor substrate, and each of the first and second transistors having a first gate separated from the first semiconductor substrate by a gate dielectric on the first semiconductor substrate;
outputting a first output voltage from a drain terminal of the first transistor;
supplying the first output voltage to an inverter;
generating a second output voltage at an output of the inverter; and
supplying the second output voltage to a second gate terminal of the first transistor and a second gate terminal of the second transistor, each of the first and second transistors having a second gate positioned in the first semiconductor substrate and separated from the respective channel region by an insulator layer on which the first semiconductor substrate is disposed, the insulator layer separating the first semiconductor substrate from a second semiconductor substrate.

16. The method of claim 15 comprising generating the second output voltage at a high logic level when the input voltage transitions from below a low threshold value to above a high threshold voltage, the high threshold value being greater than the low threshold value and lower than the high logic level.

17. The method of claim 16 comprising generating the second output voltage at a low logic level when the input voltage transitions from above the high threshold value to below the low threshold voltage, the low threshold value being greater than the low logic level.

18. The method of claim 17 comprising:
supplying the input voltage to a gate of a third transistor having a drain coupled to the source of the first transistor; and
supplying the input voltage to a gate of a fourth transistor having a drain coupled to the source of the second transistor.

* * * * *